(12) United States Patent
Endo et al.

(10) Patent No.: US 7,462,438 B2
(45) Date of Patent: Dec. 9, 2008

(54) RESIST MATERIAL AND PATTERN FORMATION METHOD USING THE SAME

(75) Inventors: Masayuki Endo, Osaka (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 191 days.

(21) Appl. No.: 11/415,158

(22) Filed: May 2, 2006

(65) Prior Publication Data

US 2006/0263719 A1 Nov. 23, 2006

(30) Foreign Application Priority Data

May 18, 2005 (JP) ............................. 2005-146057

(51) Int. Cl.
*G03F 7/00* (2006.01)
*G03F 7/004* (2006.01)

(52) U.S. Cl. ..................... 430/270.1; 430/905; 430/919

(58) Field of Classification Search .............. 430/220.1, 430/919, 905
See application file for complete search history.

(56) References Cited

U.S. PATENT DOCUMENTS 3,002,957 A * 10/1961 Berg et al. .................. 526/220
6,680,157 B1 * 1/2004 Fedynyshyn ............. 430/270.1

FOREIGN PATENT DOCUMENTS

EP 1500977 A1 * 1/2005
WO WO 0114348 A1 * 3/2001

OTHER PUBLICATIONS

Samyn et al, "Synthesis, Polymerization, and Copolymerization of Lactam-Substituted Styrenes", Journal of Polymer Science, vol. 20, 987-995 (1982).*
Masuda et al, "Tautomers As Monomers and Initiators", Prog. Polymer Science, vol. 21, 557-591(1996).*
Takanori Kudo, et al., "illumination, Acid Diffusion and Process Optimization Considerations for 193 nm Contact Hole Resists," Advances in Resist Technology and Processing XIX, 2002 Proceedings of the SPIE, pp. 150-159, vol. 4690, SPIE.

* cited by examiner

*Primary Examiner*—Amanda C. Walke
(74) *Attorney, Agent, or Firm*—McDermott Will & Emery LLP (57) ABSTRACT

A resist film made of a resist material including 4-pentanelactam, that is, hetero cyclic ketone, is formed on a substrate, and subsequently, pattern exposure is performed by irradiating the resist film with exposing light through a mask. Then, the resist film having been subjected to the pattern exposure is developed, thereby forming a resist pattern.

33 Claims, 5 Drawing Sheets

RESIST MATERIAL AND PATTERN FORMATION METHOD USING THE SAME

CROSS-REFERENCE TO RELATED APPLICATIONS

This application claims priority under 35 U.S.C. §119 on Patent Application No. 2005-146057 filed in Japan on May 18, 2005, the entire contents of which are hereby incorporated by reference.

BACKGROUND OF THE INVENTION

The present invention relates to a resist material for use in fabrication process or the like for semiconductor devices and a pattern formation method using the same.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like.

Recently, attempts have been made to apply immersion lithography to an ArF light source. Under these circumstances, it is regarded significant to increase the life of the lithography using the ArF excimer laser, and resist materials for use of the ArF excimer laser are now being developed. Some of such ArF resists may include a lactone ring in the composition of the polymer (for example, see T. Kudo et al., "Illumination, Acid Diffusion and Process Optimization Considerations for 193 nm Contact Hole Resists", Proc. SPIE, vol. 4690, p. 150 (2002)). This is because a lactone ring is expected to exhibit a function to improve the adhesive property between a resist pattern and a target film.

Now, a pattern formation method using a conventional ArF resist will be described with reference to FIGS. 5A through 5D.

Figure 5A:
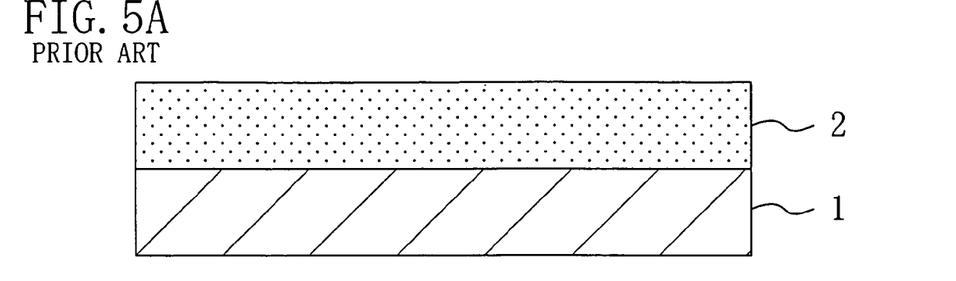
FIGS. 5A, 5B, 5C and 5D are cross-sectional views for showing procedures in a pattern formation method using a conventional resist material including lactone.

First, a positive chemically amplified resist material including lactone in its base polymer and having the following composition is prepared:

| | |
|---|---|
| Base polymer: poly(2-methyl-2-adamantyl methacrylate (50 mol %) - γ-butyrolactone methacrylate (40 mol %) - 2-hydroxyadmantyl methacrylate (10 mol %)) | 2 g |
| Acid generator: triphenylsulfonium trifluoromethane sulfonate | 0.06 g |
| Quencher: triethanolamine | 0.002 g |
| Solvent: propylene glycol monomethyl ether acetate | 20 g |

Next, as shown in FIG. 5A, the chemically amplified resist material is applied on a substrate 1, so as to form a resist film 2 with a thickness of 0.35 μm.

Figure 5B:
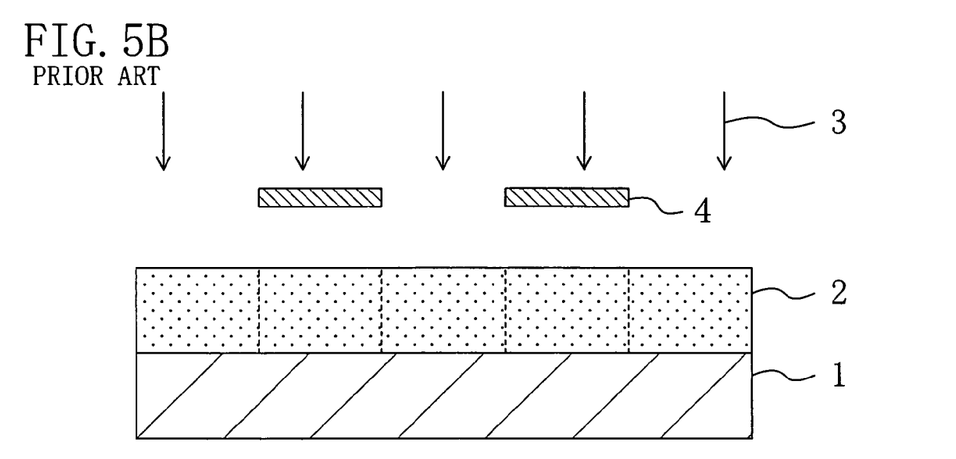

Then, as shown in FIG. 5B, the resist film 2 is subjected to pattern exposure by irradiating with exposing light 3 of ArF excimer laser with NA (numerical aperture) of 0.68 through a mask 4.

Figure 5C:
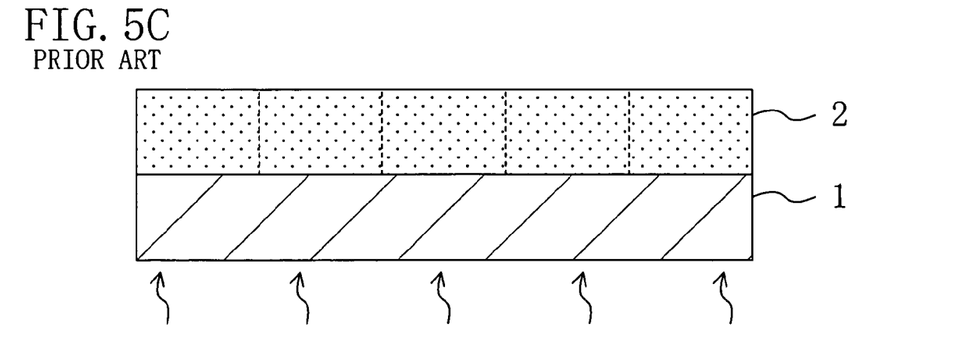

After the pattern exposure, as shown in FIG. 5C, the resist film 2 is baked at a temperature of 105° C. for 60 seconds. Thereafter, the resultant resist film 2 is developed with a 0.26 N tetramethylammonium hydroxide developer. Thus, as shown in FIG. 5D, a resist pattern 2a with a line width of 0.09 μm made of an unexposed portion of the resist film 2 is obtained.

Figure 5D:
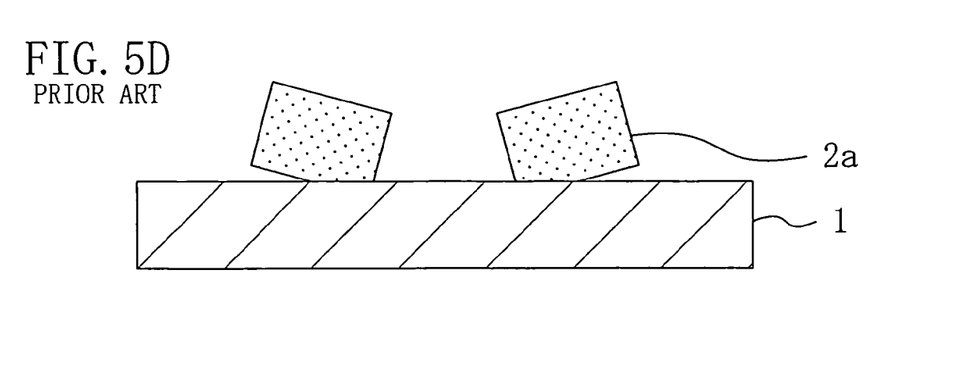

As shown in FIG. 5D, however, the resist pattern 2a obtained by the pattern formation method using the conventional ArF resist is in a defective shape.

SUMMARY OF THE INVENTION

The present inventors have made various examinations on the cause of the defective shape of the conventional resist pattern 2a, resulting in finding that the conventional resist using the polymer including a lactone ring is insufficient in the adhesive property, and hence, the resist pattern 2a is peeled off.

When a resist pattern in such a defective shape is used, the productivity and the yield in the fabrication process for semiconductor devices are disadvantageously lowered.

In consideration of the aforementioned conventional disadvantage, an object of the invention is improving the adhesive property of a resist pattern to a target film so as to prevent pattern failure.

The present inventors have found the following: Since hetero cyclic ketone (represented by Chemical Formula 1 below) or its isomer (such as lactim represented by Chemical Formula 2 below) includes a ketone group and a nitrogen atom in its cyclic structure, its electron affinity is improved so as to increase the interaction with a target film. Therefore, when a resist includes hetero cyclic ketone or its isomer, the adhesive property between a target film and the resist film can be improved. It is noted that the hetero cyclic ketone or its isomer may be singly included in the resist or may be included therein in the form of a polymer. In either case, the effect to improve the adhesive property of the resist can be attained.

Chemical Formula 1:

Chemical Formula 2:

Chemical Formula 3:

Furthermore, the present inventors also have found the following: Since hetero cyclic sulfone (represented by Chemical Formula 3 above) includes two oxygen atoms in its cyclic structure, its electron affinity is particularly increased. The electron affinity is increased not only by the oxygen atoms but also by a nitrogen atom, and hence, the interaction with a target film is increased. Therefore, when the hetero cyclic sulfone is included in a resist, the adhesive property between a target film and a resist film is improved. It is noted that the hetero cyclic sulfone may be singly included in the resist or included therein in the form of a polymer. In either case, the effect to improve the adhesive property can be attained.

When the electron affinity of a resist is increased, the adhesive property to a target film is improved because an interaction can be more easily caused between the resist and electrons present in atoms included in the target film. This will be described from the viewpoint of electronegativity. As shown in Table 1 below, as compared with lactone including carbon (C) as a skeleton and conventionally used in a chemically amplified resist, the hetero cyclic ketone includes a larger number of nitrogen (N) atoms with higher electronegativity than a carbon (C) atom and the hetero cyclic sulfone includes a larger number of nitrogen (N) atoms and oxygen (O) atoms with higher electronegativity than a carbon (C) atom. As a result, the resist includes a larger number of electrons. In other words, the electron affinity is improved and the adhesive property to a target film is improved through an electric interaction.

TABLE 1

| ELECTRONEGATIVITY | |
|---|---|
| CARBON (C) | 2.55 |
| OXYGEN (O) | 3.44 |
| NITROGEN (N) | 3.04 |
| SULFUR (S) | 2.58 |

The present invention was devised on the basis of the above findings and is specifically practiced as follows:

The first resist material of this invention includes hetero cyclic ketone or an isomer of the hetero cyclic ketone.

The second resist material of the invention includes a polymer containing hetero cyclic ketone or an isomer of the hetero cyclic ketone.

The third resist material of the invention includes hetero cyclic sulfone.

The fourth resist material of the invention includes a polymer containing hetero cyclic sulfone.

In the first or second resist material, the hetero cyclic ketone may be lactam.

In this case, the lactam may be 4-pentanelactam, 6-hexanelactam, 2-pentene-5-lactam or 3-hexene-6-lactam.

In the first or second resist material, the isomer of the hetero cyclic ketone may be lactim.

In this case, the lactim is preferably 2-pentanelactime, 6-hexanelactim, 2-pentene-5-lactim or 3-hexene-6-lactim.

In the third or fourth resist material, the hetero cyclic sulfone may be sultam.

In this case, the sultam may be butane-1,4-sultam, propane-1,3-sultam, pentane-1,5-sultam or hexane-1,6-sultam.

The first pattern formation method of this invention includes the steps of forming, on a substrate, a resist film made of a resist material including hetero cyclic ketone or an isomer of the hetero cyclic ketone; performing pattern exposure by selectively irradiating the resist film with exposing light; and forming a resist pattern by developing the resist film after the pattern exposure.

In the first pattern formation method, since the resist includes the hetero cyclic ketone or its isomer, the electron affinity of the resist including the hetero cyclic ketone or its isomer is increased. As a result, since the interaction with the substrate corresponding to a target film is increased, the adhesive property of the resist film to the substrate is improved, and hence, the resultant pattern is formed in a good shape.

The second pattern formation method of this invention includes the steps of forming, on a substrate, a resist film made of a resist material including a polymer containing hetero cyclic ketone or an isomer of the hetero cyclic ketone; performing pattern exposure by selectively irradiating the resist film with exposing light; and forming a resist pattern by developing the resist film after the pattern exposure.

In the second pattern formation method, since the resist includes the polymer containing the hetero cyclic ketone or its isomer, the electron affinity of the resist is increased by the polymer containing the hetero cyclic ketone or its isomer. As a result, since the interaction with the substrate corresponding to a target film is increased, the adhesive property of the resist film to the substrate is improved, and hence, the resultant pattern is formed in a good shape.

The third pattern formation method of this invention the steps of forming, on a substrate, a resist film made of a resist material including hetero cyclic sulfone; performing pattern exposure by selectively irradiating the resist film with exposing light; and forming a resist pattern by developing the resist film after the pattern exposure.

In the third pattern formation method, since the resist includes the hetero cyclic sulfone, the electron affinity of the resist including the hetero cyclic sulfone is increased. As a result, since the interaction with the substrate corresponding to a target film is increased, the adhesive property of the resist film to the substrate is improved, and hence, the resultant pattern is formed in a good shape.

The fourth pattern formation method of this invention includes the steps of forming, on a substrate, a resist film made of a resist material including a polymer containing hetero cyclic sulfone; performing pattern exposure by selectively irradiating the resist film with exposing light; and forming a resist pattern by developing the resist film after the pattern exposure.

In the fourth pattern formation method, since the resist includes the polymer containing the hetero cyclic sulfone, the electron affinity of the resist is increased by the polymer containing the hetero cyclic sulfone. As a result, since the interaction with the substrate corresponding to a target film is increased, the adhesive property of the resist film to the substrate is improved, and hence, the resultant pattern is formed in a good shape.

In each of the first through fourth pattern formation methods, the exposing light may be KrF excimer laser, $Xe_2$ laser, ArF excimer laser, $F_2$ laser, KrAr laser or $Ar_2$ laser.

When a resist material including a hetero cyclic compound as a single substance and a resist material including a hetero cyclic compound in the form of a polymer are compared, contact probability between the hetero cyclic compound and a substrate is higher in the resist material including the hetero cyclic compound in the form of a polymer because polymer chains are linked therein, and hence, the adhesive property to the substrate is higher in the latter hetero cyclic compound.

DETAILED DESCRIPTION OF THE INVENTION

Embodiment 1

Embodiment 1 of the invention will now be described with reference to the accompanying drawings.

FIGS. 1A through 1D are cross-sectional views for showing procedures in a pattern formation method using a chemically amplified resist material of Embodiment 1.

Figure 1A:
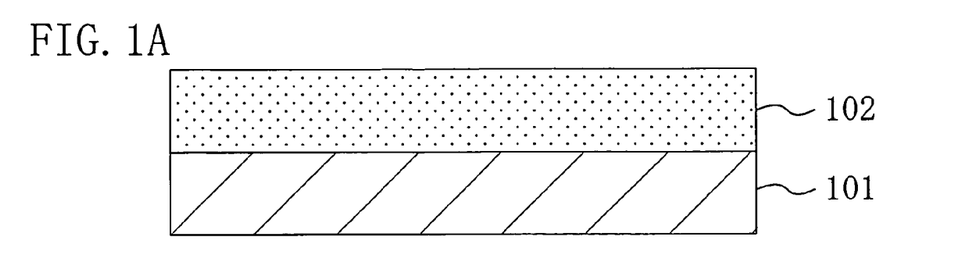
FIGS. 1A, 1B, 1C and 1D are cross-sectional views for showing procedures in a pattern formation method using a resist material according to Embodiment 1 of the invention.

First, a positive chemically amplified resist material including lactam and having the following composition is prepared:

| | |
|---|---:|
| Base polymer: poly(2-methyl-2-adamantyl methacrylate (50 mol %)-γ-butyrolactone methacrylate (40 mol %)-2-hydroxyadamantyl methacrylate (10 mol %)) | 2 g |
| Hetero cyclic ketone: 4-pentanelactam | 0.6 g |
| Acid generator: triphenylsulfonium trifluoromethane sulfonate | 0.06 g |
| Quencher: triethanolamine | 0.002 g |
| Solvent: propylene glycol monomethyl ether acetate | 20 g |

Next, as shown in FIG. 1A, the chemically amplified resist material is applied on a substrate 101, so as to form a resist film 102 with a thickness of 0.35 µm.

Figure 1B:
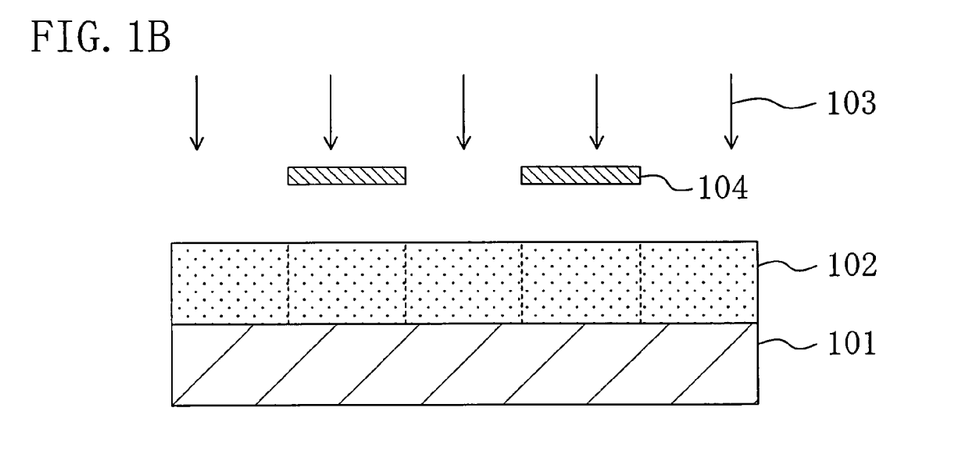

Then, as shown in FIG. 1B, the resist film 102 is subjected to pattern exposure by irradiating with exposing light 103 of ArF excimer laser having NA of 0.68 through a mask 104.

Figure 1C:
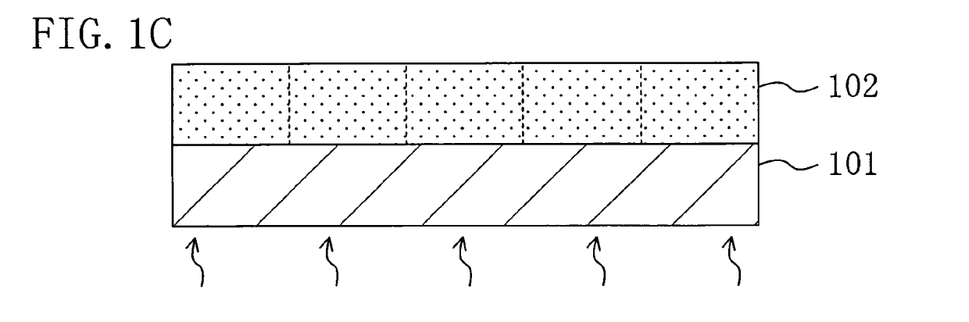
Figure 1D:
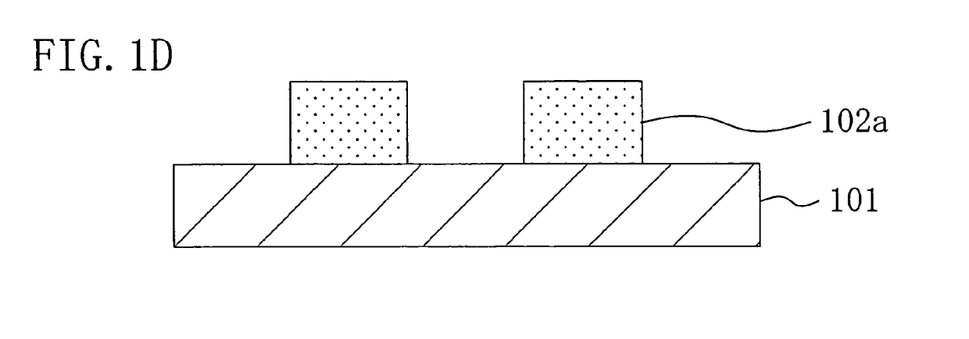

After the pattern exposure, as shown in FIG. 1C, the resist film 102 is baked by using a hot plate at a temperature of 105° C. for 60 seconds. Thereafter, the resultant resist film 102 is developed with a 0.26 N tetramethylammonium hydroxide developer. Thus, as shown in FIG. 1D, a resist pattern 102a made of an unexposed portion of the resist film 102 and having a line width of 0.09 µm is obtained.

In this manner, according to Embodiment 1, the chemically amplified resist material includes the lactam (4-pentanelactam), that is, hetero cyclic ketone, and therefore, the electron affinity of the resist is improved by a ketone group and a nitrogen atom included in the lactam. Accordingly, the interaction between the resist film 102 and the substrate 101 is increased, so as to improve the adhesive property of the resist film 102 to the substrate 101. As a result, the resist pattern 102a free from peeling can be formed in a good shape.

Embodiment 2

Embodiment 2 of the invention will now be described with reference to the accompanying drawings.

FIGS. 2A through 2D are cross-sectional views for showing procedures in a pattern formation method using a chemically amplified resist material of Embodiment 2.

Figure 2A:
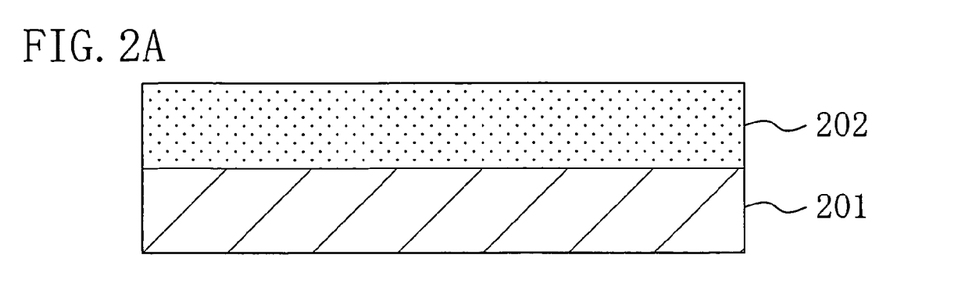
FIGS. 2A, 2B, 2C and 2D are cross-sectional views for showing procedures in a pattern formation method using a resist material according to Embodiment 2 of the invention.

First, a positive chemically amplified resist material including lactam in its base polymer and having the following composition is prepared:

| | |
|---|---:|
| Base polymer: poly(2-methyl-2-adamantyl methacrylate (50 mol %)-4-pentanelactam methacrylate (40 mol %)-2-hydroxyadamantyl methacrylate (10 mol %)) | 2 g |
| Acid generator: triphenylsulfonium trifluoromethane sulfonate | 0.06 g |
| Quencher: triethanolamine | 0.002 g |
| Solvent: propylene glycol monomethyl ether acetate | 20 g |

Next, as shown in FIG. 2A, the chemically amplified resist material is applied on a substrate 201, so as to form a resist film 202 with a thickness of 0.35 µm.

Figure 2B:
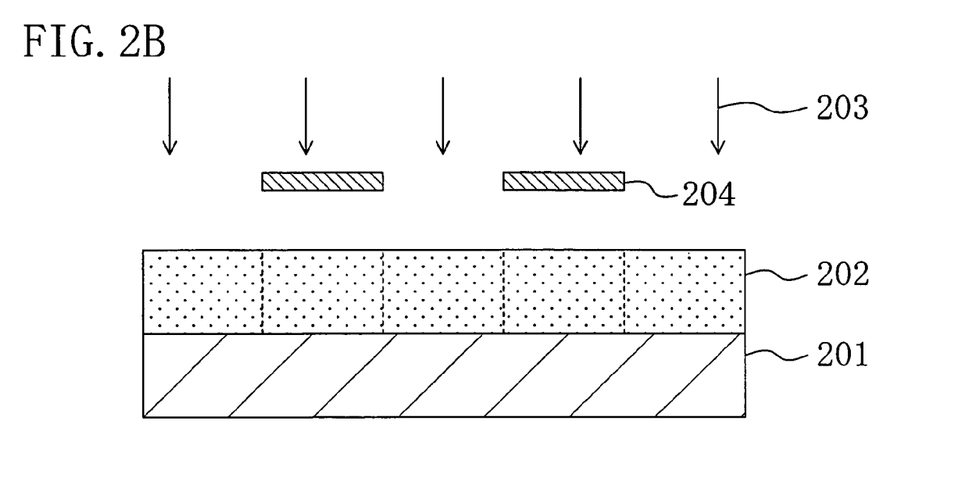

Then, as shown in FIG. 2B, the resist film 202 is subjected to pattern exposure by irradiating with exposing light 203 of ArF excimer laser having NA of 0.68 through a mask 204.

Figure 2C:
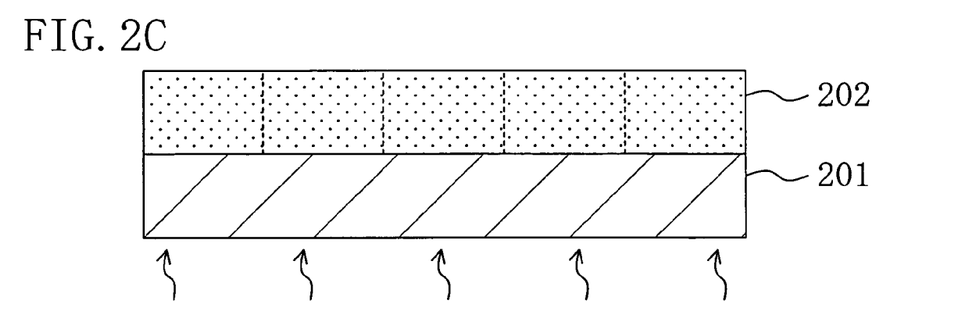
Figure 2D:
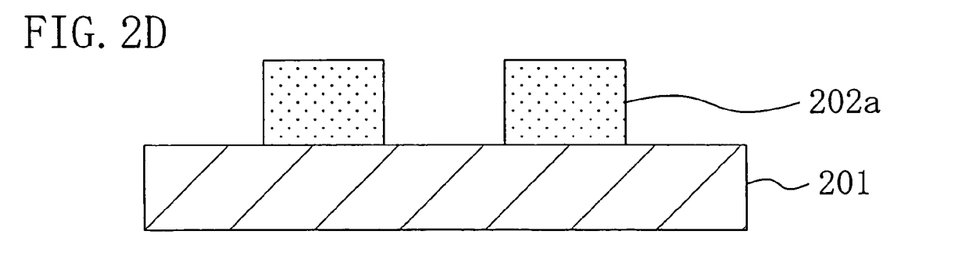

After the pattern exposure, as shown in FIG. 2C, the resist film 202 is baked by using a hot plate at a temperature of 105° C. for 60 seconds. Thereafter, the resultant resist film 202 is developed with a 0.26 N tetramethylammonium hydroxide developer. Thus, as shown in FIG. 2D, a resist pattern 202a made of an unexposed portion of the resist film 202 and having a line width of 0.09 µm is obtained.

In this manner, according to Embodiment 2, the chemically amplified resist material includes, in its base polymer, the lactam (4-pentanelactam methacrylate), that is, hetero cyclic ketone, and therefore, the electron affinity of the resist is improved by a ketone group and a nitrogen atom included in the lactam. Accordingly, the interaction between the resist film 202 and the substrate 201 is increased, so as to improve the adhesive property of the resist film 202 to the substrate 201. As a result, the resist pattern 202a free from peeling can be formed in a good shape.

In each of Embodiments 1 and 2, 4-pentanelactam can be replaced with 6-hexanelactam, 2-pentene-5-lactam or 3-hexene-6-lactam.

Alternatively, lactim, that is, an isomer of lactam, may be used instead, and for example, 2-pentanelactim, 6-hexanelactim, 2-pentene-5-lactim or 3-hexene-6-lactim may be used.

Embodiment 3

Embodiment 3 of the invention will now be described with reference to the accompanying drawings.

FIGS. 3A through 3D are cross-sectional views for showing procedures in a pattern formation method using a chemically amplified resist material of Embodiment 3.

Figure 3A:
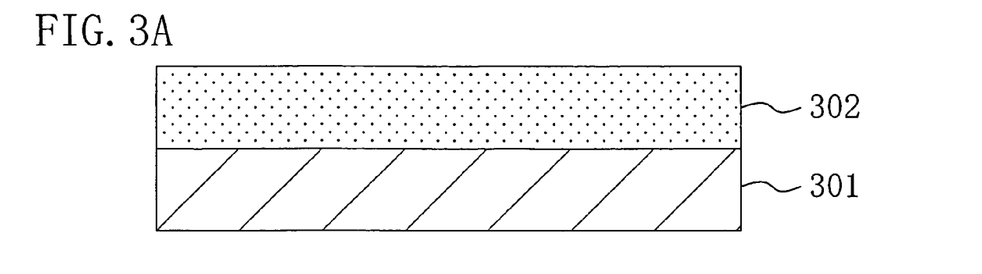
FIGS. 3A, 3B, 3C and 3D are cross-sectional views for showing procedures in a pattern formation method using a resist material according to Embodiment 3 of the invention.

First, a positive chemically amplified resist material including sultam and having the following composition is prepared:

| | |
|---|---:|
| Base polymer: poly(2-methyl-2-adamantyl methacrylate (50 mol %)-γ-butyrolactone methacrylate (40 mol %)-2-hydroxyadamantyl methacrylate (10 mol %)) | 2 g |
| Hetero cyclic sulfone: butane-1,4-sultam | 0.5 g |
| Acid generator: triphenylsulfonium trifluoromethane sulfonate | 0.06 g |
| Quencher: triethanolamine | 0.002 g |
| Solvent: propylene glycol monomethyl ether acetate | 20 g |

Next, as shown in FIG. 3A, the chemically amplified resist material is applied on a substrate 301, so as to form a resist film 302 with a thickness of 0.35 µm.

Figure 3B:
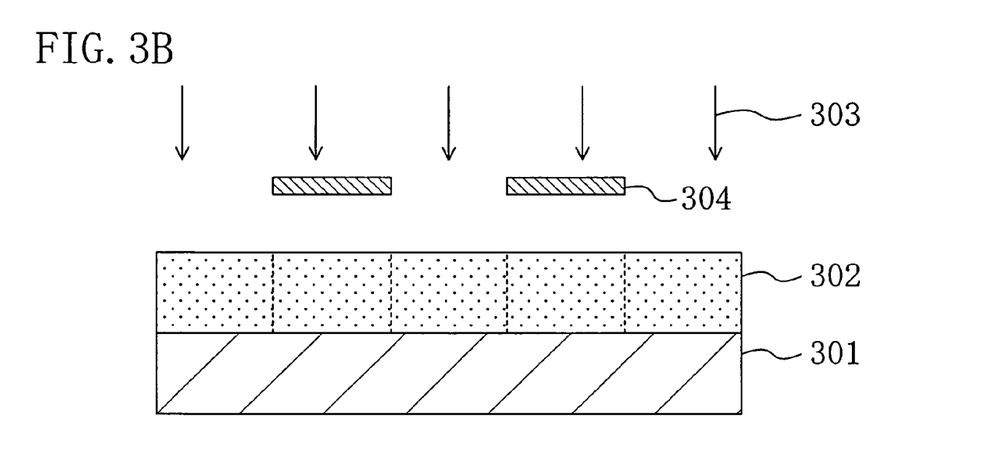

Then, as shown in FIG. 3B, the resist film 302 is subjected to pattern exposure by irradiating with exposing light 303 of ArF excimer laser having NA of 0.68 through a mask 304.

Figure 3C:
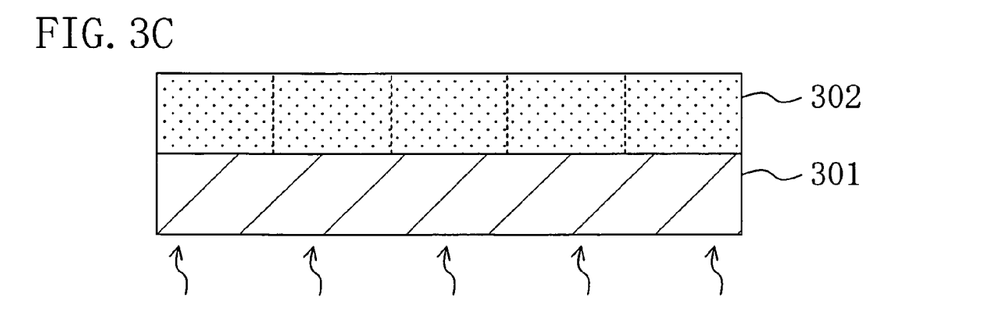
Figure 3D:
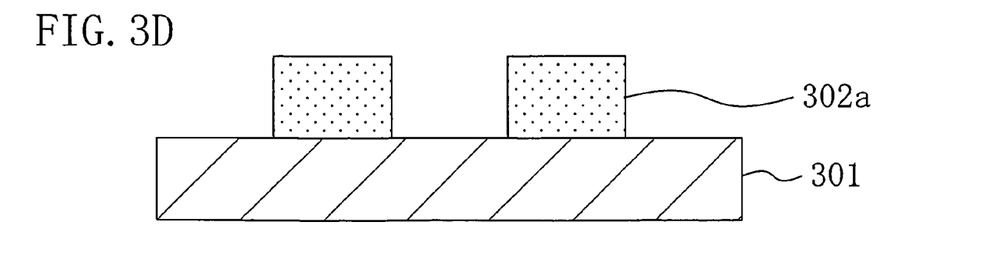

After the pattern exposure, as shown in FIG. 3C, the resist film 302 is baked by using a hot plate at a temperature of 105° C. for 60 seconds. Thereafter, the resultant resist film 302 is developed with a 0.26 N tetramethylammonium hydroxide developer. Thus, as shown in FIG. 3D, a resist pattern 302a made of an unexposed portion of the resist film 302 and having a line width of 0.09 µm is obtained.

In this manner, according to Embodiment 3, the chemically amplified resist material includes the sultam (butane-1,4-sultam), that is, hetero cyclic sulfone, and therefore, the electron affinity of the resist is improved by a nitrogen atom and two oxygen atoms included in the sultam. Accordingly, the interaction between the resist film 302 and the substrate 301 is increased, so as to improve the adhesive property of the resist film 302 to the substrate 301. As a result, the resist pattern 302a free from peeling can be formed in a good shape.

Embodiment 4

Embodiment 4 of the invention will now be described with reference to the accompanying drawings.

FIGS. 4A through 4D are cross-sectional views for showing procedures in a pattern formation method using a chemically amplified resist material of Embodiment 4.

Figure 4A:
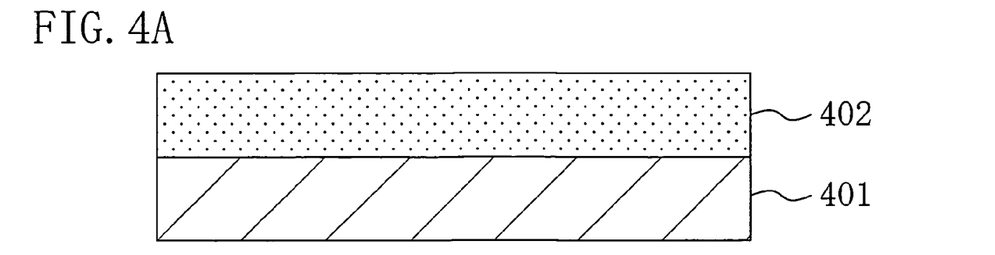
FIGS. 4A, 4B, 4C and 4D are cross-sectional views for showing procedures in a pattern formation method using a resist material according to Embodiment 4 of the invention.

First, a positive chemically amplified resist material including sultam in its base polymer and having the following composition is prepared:

| | |
|---|---|
| Base polymer: poly(2-methyl-2-adamantyl methacrylate (50 mol %)-butane-1,4-sultam methacrylate (40 mol %)-2-hydroxyadamantyl methacrylate (10 mol %)) | 2 g |
| Acid generator: triphenylsulfonium trifluoromethane sulfonate | 0.06 g |
| Quencher: triethanolamine | 0.002 g |
| Solvent: propylene glycol monomethyl ether acetate | 20 g |

Next, as shown in FIG. 4A, the chemically amplified resist material is applied on a substrate 401, so as to form a resist film 402 with a thickness of 0.35 µm.

Figure 4B:
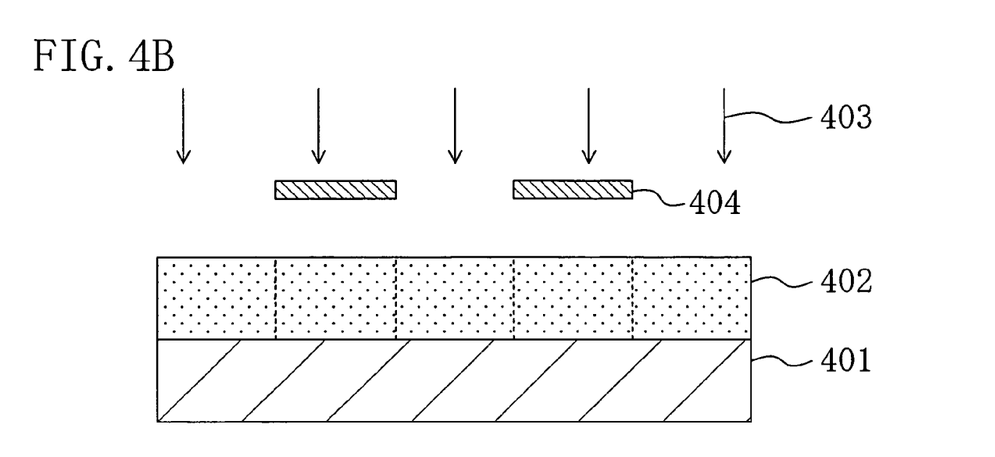

Then, as shown in FIG. 4B, the resist film 402 is subjected to pattern exposure by irradiating with exposing light 403 of ArF excimer laser having NA of 0.68 through a mask 404.

Figure 4C:
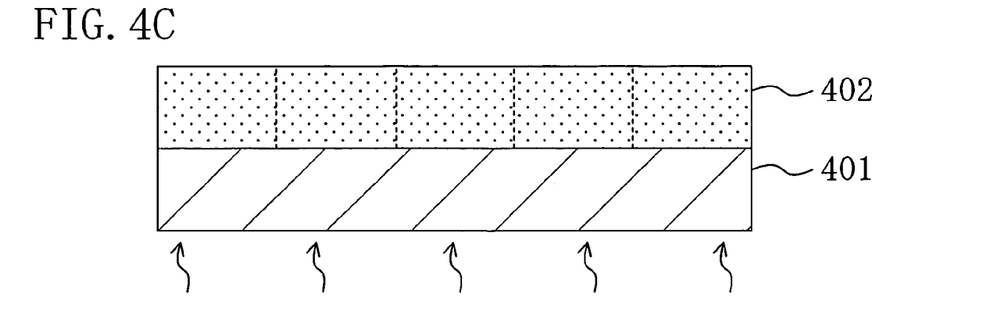
Figure 4D:
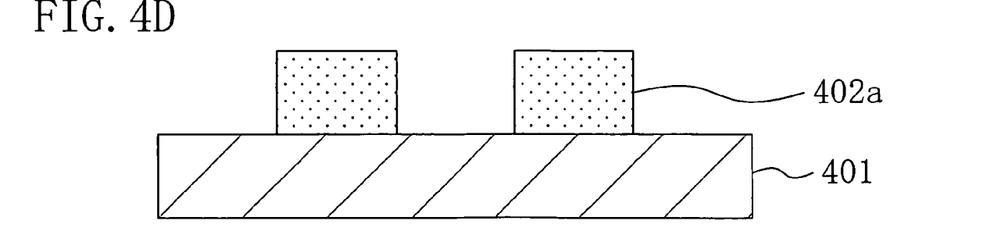

After the pattern exposure, as shown in FIG. 4C, the resist film 402 is baked by using a hot plate at a temperature of 105° C. for 60 seconds. Thereafter, the resultant resist film 402 is developed with a 0.26 N tetramethylammonium hydroxide developer. Thus, as shown in FIG. 4D, a resist pattern 402a made of an unexposed portion of the resist film 402 and having a line width of 0.09 µm is obtained.

In this manner, according to Embodiment 4, the chemically amplified resist material includes, in its base polymer, the sultam (butane-1,4-sultam methacrylate), that is, hetero cyclic sulfone, and therefore, the electron affinity of the resist is improved by a nitrogen atom and two oxygen atoms included in the sultam. Accordingly, the interaction between the resist film 402 and the substrate 401 is increased, so as to improve the adhesive property of the resist film 402 to the substrate 401. As a result, the resist pattern 402a free from peeling can be formed in a good shape.

In each of Embodiments 3 and 4, the butane-1,4-sultam may be replaced with propane-1,3-sultam, pentane-1,5-sultam or hexane-1,6-sultam.

Furthermore, in each of Embodiments 1 through 4, the exposing light is not limited to the ArF excimer laser but may be KrF excimer laser, $Xe_2$ laser, $F_2$ laser, KrAr laser or $Ar_2$ laser.

Moreover, the resist material of each embodiment is applicable to the immersion lithography in which the exposure of a resist film is performed with a liquid for increasing the NA value provided between the resist film and a projection lens.

As described so far, according to the resist material and the pattern formation method using the same of the invention, the interaction between a substrate on which a resist pattern is to be formed and a resist film is increased, and hence, the adhesive property of the resist film to the substrate is improved, resulting in forming the resist pattern in a good shape. Thus, the invention is useful for, for example, a method for forming a fine pattern on a substrate.

What is claimed is:

1. A resist material comprising:
   a base polymer and at least one of lactam and lactim, wherein said lactam is 4-pentanelactam, 6-hexanelactam, 2-pentene-5-lactam or 3-hexene-6-lactam.

2. The resist material of claim 1,
   wherein said lactim is 2-pentanelactime, 6-hexanelactim, 2-pentene-5-lactim or 3-hexene-6-lactim.

3. A resist material comprising:
   a polymer including as a substituent at least one of a hetero cyclic ketone or an isomer of said hetero cyclic ketone, wherein said hetero cyclic ketone includes a nitrogen atom in the heterocycle.

4. The resist material of claim 3,
   wherein said hetero cyclic ketone is lactam.

5. The resist material of claim 4,
   wherein said lactam is 4-pentanelactam, 6-hexanelactam, 2-pentene-5-lactam or 3-hexene-6-lactam.

6. The resist material of claim 3,
   wherein said isomer of said hetero cyclic ketone is lactim.

7. The resist material of claim 6,
   wherein said lactim is 2-pentanelactime, 6-hexanelactim, 2-pentene-5-lactim or 3-hexene-6-lactim.

8. A resist material comprising:
   a base polymer and hetero cyclic sulfone,
   wherein said hetero cyclic sulfone includes a nitrogen atom in the heterocycle.

9. The resist material of claim 8,
   wherein said hetero cyclic sulfone is sultam.

10. The resist material of claim 9,
    wherein said sultam is butane-1,4-sultam, propane-1,3-sultam, pentane-1,5-sultam or hexane-1,6-sultam.

11. A resist material comprising:
    a polymer including hetero cyclic sulfone,
    wherein said hetero cyclic sulfone includes a nitrogen atom in the heterocycle.

12. The resist material of claim 11,
    wherein said hetero cyclic sulfone is sultam.

13. The resist material of claim 12,
    wherein said sultam is butane-1,4-sultam, propane-1,3-sultam, pentane-1,5-sultam or hexane-1,6-sultam.

14. A pattern formation method comprising the steps of:
    forming a resist film on a substrate;
    performing pattern exposure by selectively irradiating said resist film with exposing light;
    forming a resist pattern by developing said resist film after the pattern exposure; and
    wherein a resist material forming said resist film includes a base polymer and at least one of lactam and lactim and said lactam is 4-pentanelactam, 6-hexanelactam, 2-pentene-5-lactam or 3-hexene-6-lactam.

15. The pattern formation method of claim 14,
    wherein said lactim is 2-pentanelactime, 6-hexanelactim, 2-pentene-5-lactim or 3-hexene-6-lactim.

16. The pattern formation method of claim 14,
    wherein said exposing light is KrF excimer laser, $Xe_2$ laser, ArF excimer laser, $F_2$ laser, KrAr laser or $Ar_2$ laser.

17. A pattern formation method comprising the steps of:
forming a resist film on a substrate;
performing pattern exposure by selectively irradiating said resist film with exposing light;
forming a resist pattern by developing said resist film after the pattern exposure; and
wherein a resist material forming said resist film comprises a polymer including as a substituent at least one of hetero cyclic ketone or an isomer of said hetero cyclic ketone, and
said hetero cyclic ketone and said isomer include a nitrogen atom in the heterocycle.

18. The pattern formation method of claim 17,
wherein said hetero cyclic ketone is lactam.

19. The pattern formation method of claim 18,
wherein said lactam is 4-pentanelactam, 6-hexanelactam, 2-pentene-5-lactam or 3-hexene-6-lactam.

20. The pattern formation method of claim 17,
wherein said isomer of said hetero cyclic ketone is lactim.

21. The pattern formation method of claim 20,
wherein said lactim is 2-pentanelactime, 6-hexanelactim, 2-pentene-5-lactim or 3-hexene-6-lactim.

22. The pattern formation method of claim 17,
wherein said exposing light is KrF excimer laser, $Xe_2$ laser, ArF excimer laser, $F_2$ laser, KrAr laser or $Ar_2$ laser.

23. The pattern formation method of claim 17, wherein said polymer is a base polymer.

24. A pattern formation method comprising the steps of:
forming a resist film on a substrate;
performing pattern exposure by selectively irradiating said resist film with exposing light;
forming a resist pattern by developing said resist film after the pattern exposure; and
wherein a resist material forming said resist film comprises a base polymer and hetero cyclic sulfone, and
said hetero cyclic sulfone includes a nitrogen atom in the heterocycle.

25. The pattern formation method of claim 24,
wherein said hetero cyclic sulfone is sultam.

26. The pattern formation method of claim 25,
wherein said sultam is butane-1,4-sultam, propane-1,3-sultam, pentane-1,5-sultam or hexane-1,6-sultam.

27. The pattern formation method of claim 24,
wherein said exposing light is KrF excimer laser, $Xe_2$ laser, ArF excimer laser, $F_2$ laser, KrAr laser or $Ar_2$ laser.

28. A pattern formation method comprising the steps of:
forming a resist film on a substrate;
performing pattern exposure by selectively irradiating said resist film with exposing light;
forming a resist pattern by developing said resist film after the pattern exposure; and
wherein a resist material forming said resist film comprises a polymer including hetero cyclic sulfone, and
said hetero cyclic sulfone includes a nitrogen atom in the heterocycle.

29. The pattern formation method of claim 28,
wherein said hetero cyclic sulfone is sultam.

30. The pattern formation method of claim 29,
wherein said sultam is butane-1,4-sultam, propane-1,3-sultam, pentane-1,5-sultam or hexane-1,6-sultam.

31. The pattern formation method of claim 28,
wherein said exposing light is KrF excimer laser, $Xe_2$ laser, ArF excimer laser, $F_2$ laser, KrAr laser or $Ar_2$ laser.

32. The pattern formation method of claim 28, wherein said polymer includes hetero cyclic sulfone as a substituent.

33. The pattern formation method of claim 28, wherein said polymer is a base polymer.

* * * * *